United States Patent
Kouno et al.

(10) Patent No.: US 6,784,548 B2
(45) Date of Patent: Aug. 31, 2004

(54) SEMICONDUCTOR DEVICE HAVING DUMMY PATTERNS FOR METAL CMP

(75) Inventors: Hiroyuki Kouno, Tokyo (JP); Toshio Kumamoto, Tokyo (JP); Takahiro Miki, Tokyo (JP); Hisayasu Satoh, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 72 days.

(21) Appl. No.: 10/309,272

(22) Filed: Dec. 4, 2002

(65) Prior Publication Data

US 2003/0071263 A1 Apr. 17, 2003

Related U.S. Application Data

(62) Division of application No. 09/974,856, filed on Oct. 12, 2001, now Pat. No. 6,522,007.

(51) Int. Cl.$^7$ .......................... H01L 23/48; H01L 23/52; H01L 29/40
(52) U.S. Cl. .......................... 257/758; 257/759; 257/760
(58) Field of Search ................................ 257/758, 759, 257/760

(56) References Cited

U.S. PATENT DOCUMENTS

| | | | |
|---|---|---|---|
| 5,970,238 A | | 10/1999 | Shibata et al. |
| 6,649,997 B2 | * | 11/2003 | Koike .......................... 257/529 |

FOREIGN PATENT DOCUMENTS

| | | |
|---|---|---|
| JP | 9-306996 | 11/1997 |
| JP | 10-107148 | 4/1998 |
| JP | 10-256255 | 9/1998 |
| JP | 2000-338646 | 12/2000 |
| JP | 2001-7107 | 1/2001 |

OTHER PUBLICATIONS

H.P. Tuinhout, et al., Proc, IEEE 1997 Int. Conference on Microelectronic Test Strutures, vol. 11, pp. 179–183, "Test Structures for Investigation of Metal Coverage Effects on Mosfet Matching", Mar. 1997.

M. Miyajima, Applied Physics, vol. 68, No.11, pp. 1243–1246, "The States of the Art and Trend of Metal CMP", 1999 (with partial English translation).

* cited by examiner

Primary Examiner—Thien F Tran
(74) Attorney, Agent, or Firm—Oblon, Spivak, McClelland, Maier & Neustadt, P.C.

(57) ABSTRACT

A gate electrode has a relatively long gate length of e.g., about 10 $\mu$m. In a region immediately above the gate electrode which is sandwiched between first-layer metals provided is a metal dummy pattern having a width in the first direction and extending in the second direction perpendicular to a direction of gate length (direction of current flow). Moreover, a geometric center of the metal dummy pattern in the second direction is equal to a geometric center of the gate electrode in the second direction. This maintains the symmetry in shape of the metal dummy pattern as viewed from the gate electrode. Such a structure can make deterioration in characteristics of a plurality of elements uniform while maintaining the essential effect of a metal CMP.

6 Claims, 15 Drawing Sheets

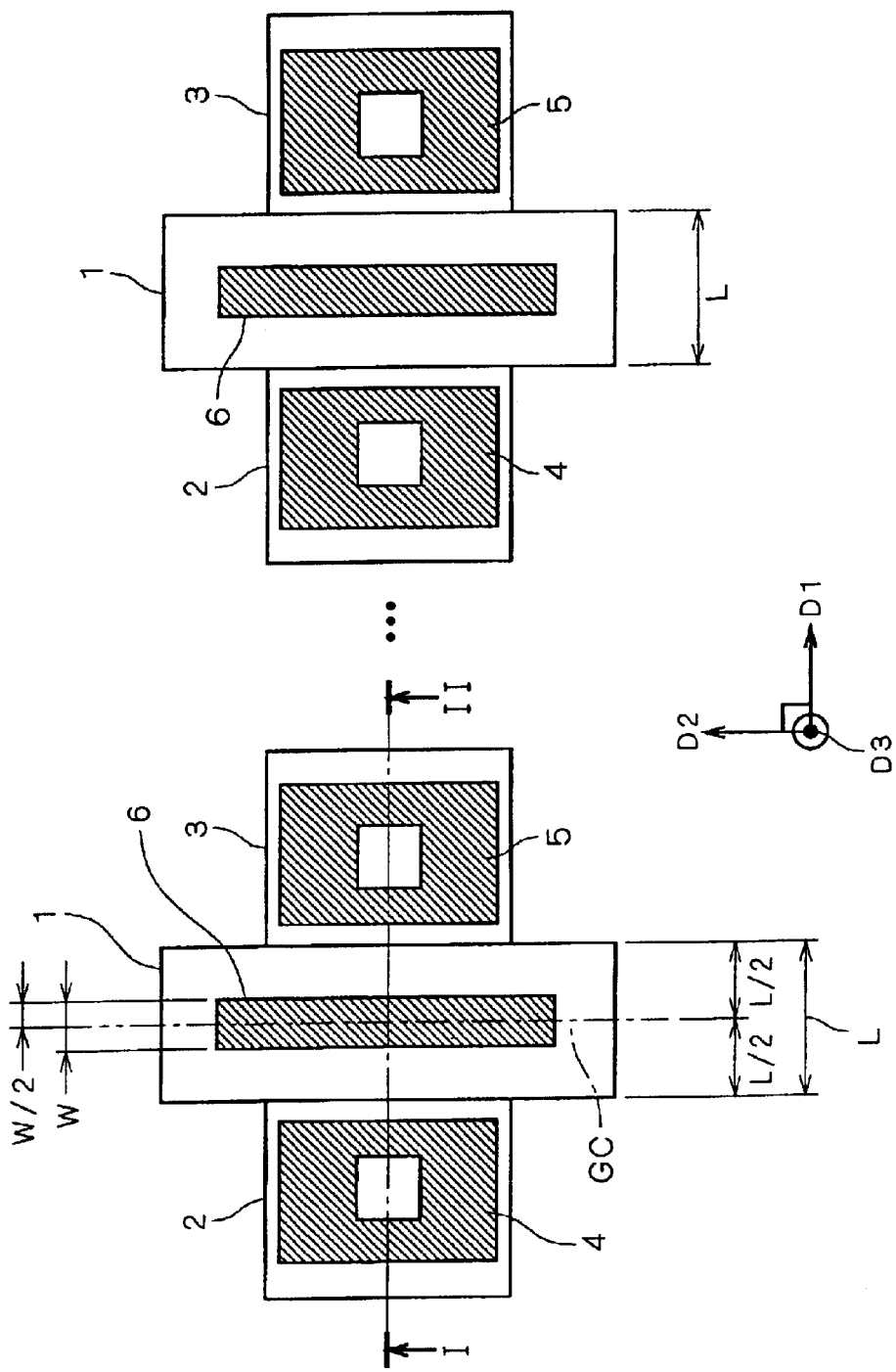
F I G . 1

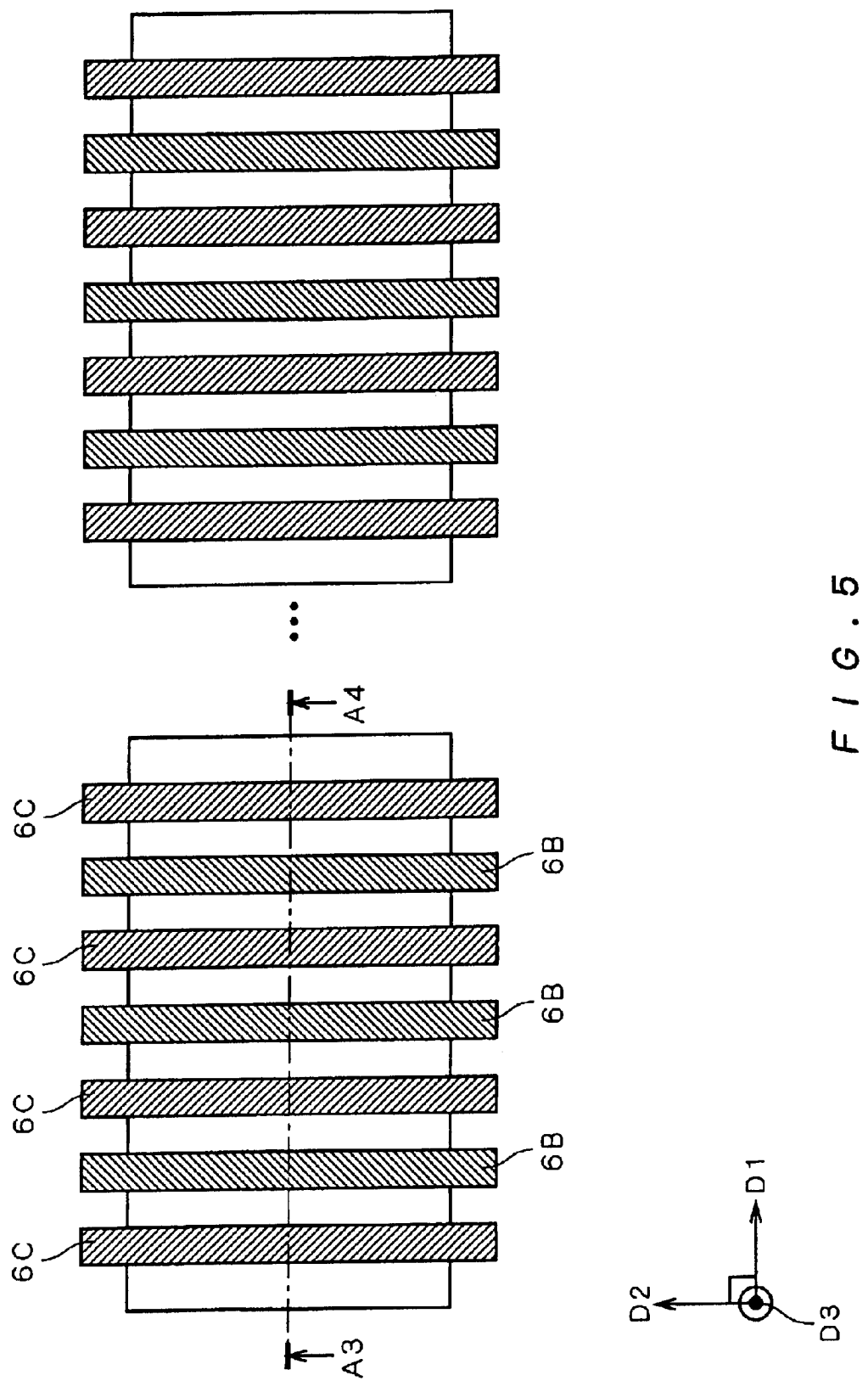
F I G . 5

NMOS TRANSISTOR

PMOS TRANSISTOR

IN A CASE OF A PLURALITY OF TRANSISTORS :
CURRENT SOURCE CIRCUIT OF CASCODE CONNECTION

IN A CASE OF A PLURALITY OF TRANSISTORS :
DIFFERENTIAL FOLDED CASCODE AMPLIFIER

SEMICONDUCTOR DEVICE HAVING DUMMY PATTERNS FOR METAL CMP

BACKGROUND OF THE INVENTION

1. Field of the Invention

The present invention relates to a semiconductor device, and more particularly to a technique of arranging dummy patterns for metal CMP (Chemical Mechanical Polishing).

2. Description of the Background Art

With refinement of patterns of semiconductor devices, a metal CMP technique has been used as a technique of planarizing interlayer insulating films in multilayer interconnections (the first background art: "The State of The Art and Trend of Metal CMP", Applied Physics Vol. 68, No. 11, 1999, pp. 1243–1246).

Further, according to the second background art (Japanese Patent Application Laid Open Gazette No. 09-306996), the third background art (Japanese Patent Application Laid Open Gazette No. 10-256255) and the fourth background art (Japanese Patent Application Laid Open Gazette No. 2000-338646), since use of the metal CMP in a case where patterns have large difference in density is likely to cause excessive polishing in a portion of small pattern density (less dense portion), it is proposed that dummy patterns should be provided in a portion of small pattern density besides normal patterns which are originally needed so as to avoid the excessive polishing in the less dense portion for prevention of pattern removal and achieve a further planarization of interlayer insulating films. A process of forming such dummy patterns depends on design rules in layout design of wiring pattern and the amount of data in formation of mask pattern.

Furthermore, the fifth background art (Japanese Patent Application Laid Open Gazette No. 2000-007107) proposes to form dummy patterns besides normal patterns for prevention of excessive erosion caused by use of the metal CMP.

When a MOSFET (Metal Oxide Semiconductor Field Effect Transistor) having a relatively long gate length (e.g., about 10 $\mu$m) is formed on a semiconductor substrate, the pattern density in a MOSFET formation region becomes small. If the metal CMP is performed in a process of manufacturing such a semiconductor device, the metal CMP causes an excessive erosion in the MOSFET formation region and as a result, there is a possibility that a desired planeness may not be obtained. That raises necessity of arranging metal dummy patterns for the metal CMP above a gate electrode of the MOSFET having a relatively long gate length.

The sixth background art (Proc. IEEE 1997 Int. Conference on Microelectronic Test Structure, Vol. 11, March 1997), however, reports that covering an upper layer of a MOS-structure transistor with a metal layer may cause deterioration in characteristics of transistors, such as deterioration in drain currents.

Therefore, formation of dummy patterns above a gate electrode causes a problem that characteristics of a plurality of MOS-structure transistors can not become uniform.

Such a problem arises not only in the MOS-structure transistors having a relatively long gate length but also in other elements. Specifically arises the problem of deterioration in characteristics of elements also when metal dummy patterns are provided above a plurality of resistive elements and metal dummy patterns are provided below an inductor.

SUMMARY OF THE INVENTION

The present invention is directed to a semiconductor device. According to a first aspect of the present invention, the semiconductor device comprises: a semiconductor substrate; a MOS-structure transistor formed on a main surface of the semiconductor substrate, comprising a first main electrode region, a second main electrode region and a gate electrode for controlling currents flowing between the first main electrode region and the second main electrode region; an interlayer insulating film formed on an upper surface of the gate electrode, covering the MOS-structure transistor; and a metal dummy pattern formed on an upper surface of the interlayer insulating film and positioned above the upper surface of the gate electrode, and in the semiconductor device of the first aspect, the first main electrode region is opposed to the second main electrode region in a first direction which corresponds to a direction of gate length of the gate electrode, the first main electrode region, the second main electrode region, the gate electrode and the metal dummy pattern extend in a second direction perpendicular to the first direction, which corresponds to a direction of gate width of the gate electrode, and a geometric center of the gate electrode in the second direction coincides with a geometric center of the metal dummy pattern in the second direction.

According to a second aspect of the present invention, in the semiconductor device of the first aspect, the interlayer insulating film and the metal dummy pattern are defined as a first interlayer insulating film and a first-layer metal dummy pattern, respectively, and the semiconductor device of the second aspect further comprises: a second interlayer insulating film covering the first interlayer insulating film and the first-layer metal dummy pattern; and a plurality of second-layer metal dummy patterns formed on portions of an upper surface of the second interlayer insulating film other than a portion above the first-layer metal dummy pattern and arranged in stripes at first intervals in the first direction, and in the semiconductor device of the second aspect, each of the plurality of second-layer metal dummy patterns extends in the second direction, the first-layer metal dummy pattern and the plurality of second-layer metal dummy patterns are arranged at a second interval in a third direction perpendicular to the first direction and the second direction, and a width of each of the plurality of second-layer metal dummy patterns in the first direction is equal to that of the first-layer metal dummy pattern in the first direction.

According to a third aspect of the present invention, the semiconductor device of the second aspect further comprises: a third interlayer insulating film covering the second interlayer insulating film and the plurality of second-layer metal dummy patterns; and a plurality of third-layer metal dummy patterns formed on portions of an upper surface of the third interlayer insulating film other than portions above the plurality of second-layer metal dummy patterns and arranged in stripes at the first intervals in the first direction, and in the semiconductor device of the third aspect, each of the plurality of third-layer metal dummy patterns extends in the second direction, one of the plurality of third-layer metal dummy patterns is positioned above the first-layer metal dummy pattern, a width of each of the plurality of third-layer metal dummy patterns in the first direction is equal to that of the first-layer metal dummy pattern in the first direction, and an interval between the plurality of second-layer metal dummy patterns and the plurality of third-layer metal dummy patterns in the third direction is equal to the second interval.

According to a fourth aspect of the present invention, the semiconductor device of the third aspect further comprises: a fourth interlayer insulating film covering the third interlayer insulating film and the plurality of third-layer metal dummy patterns; and a plurality of fourth-layer metal dummy patterns formed on portions of an upper surface of the fourth interlayer insulating film other than portions above the plurality of third-layer metal dummy patterns and arranged in stripes at the first intervals in the first direction, and in the semiconductor device of the fourth aspect, each of the plurality of fourth-layer metal dummy patterns extends in the second direction, each of the plurality of fourth-layer metal dummy patterns is positioned above a corresponding one out of the plurality of second-layer metal dummy patterns, a width of each of the plurality of fourth-layer metal dummy patterns in the first direction is equal to that of the first-layer metal dummy pattern in the first direction, and an interval between the plurality of third-layer metal dummy patterns and the plurality of fourth-layer metal dummy patterns in the third direction is equal to the second interval.

According to a fifth aspect of the present invention, in the semiconductor device of the first aspect, the first main electrode region and the second main electrode region correspond to a source and a drain, respectively, the metal dummy pattern is electrically connected to the source, and a potential of the source is fixed at a predetermined value.

According to a sixth aspect of the present invention, in the semiconductor device of the first aspect, the first main electrode region and the second main electrode region correspond to a source and a drain, respectively, and the metal dummy pattern is electrically connected to the drain.

According to a seventh aspect of the present invention, the semiconductor device comprises: a semiconductor substrate; an insulating film formed on a main surface of the semiconductor substrate; and a plurality of resistive elements formed on an upper surface of the insulating film and arranged in a first direction, and in the semiconductor device of the seventh aspect, each of the plurality of resistive elements extends in a second direction perpendicular to the first direction, which corresponds to a direction of current flow in the each of resistive elements, and the semiconductor device of the seventh aspect further comprises: an interlayer insulating film covering the insulating film and the plurality of resistive elements; and a plurality of metal dummy patterns formed on an upper surface of the interlayer insulating film and arranged in stripes at first intervals in the second direction, and in the semiconductor device of the seventh aspect, each of the plurality of metal dummy patterns extends in the first direction.

According to an eighth aspect of the present invention, in the semiconductor device of the seventh aspect, the interlayer insulating film and the plurality of metal dummy patterns are defined as a first interlayer insulating film and a plurality of first-layer metal dummy patterns, respectively, and the semiconductor device of the eighth aspect further comprises: a second interlayer insulating film formed on an upper surface of the first interlayer insulating film, covering the first interlayer insulating film and the plurality of first-layer metal dummy patterns; and a plurality of second-layer metal dummy patterns formed on portions of an upper surface of the second interlayer insulating film other than the portions above the plurality of first-layer metal dummy patterns and arranged in stripes at the first intervals in the second direction, and in the semiconductor device of the eighth aspect, each of the plurality of second-layer metal dummy patterns extends in the first direction, the plurality of first-layer metal dummy patterns and the plurality of second-layer metal dummy patterns are arranged at a second interval in a third direction perpendicular to the first direction and the second direction, and a width of each of the plurality of second-layer metal dummy patterns in the second direction is equal to that of each of the plurality of first-layer metal dummy patterns in the second direction.

According to a ninth aspect of the present invention, the semiconductor device of the eighth aspect further comprises: a third interlayer insulating film formed on an upper surface of the second interlayer insulating film, covering the second interlayer insulating film and the plurality of second-layer metal dummy patterns; and a plurality of third-layer metal dummy patterns formed on portions of an upper surface of the third interlayer insulating film other than the portions above the plurality of second-layer metal dummy patterns and arranged in stripes at the first intervals in the second direction, and in the semiconductor device of the ninth aspect, each of the plurality of third-layer metal dummy patterns extends in the first direction, a geometric center of each of the plurality of third-layer metal dummy patterns in the first direction coincides with that of a corresponding one of the plurality of first-layer metal dummy patterns in the first direction, the plurality of second-layer metal dummy patterns and the plurality of third-layer metal dummy patterns are arranged at the second interval in the third direction, and a width of each of the plurality of third-layer metal dummy patterns in the second direction is equal to that of each of the plurality of first-layer metal dummy patterns in the second direction.

According to a tenth aspect of the present invention, the semiconductor device of the ninth aspect further comprises: a fourth interlayer insulating film formed on an upper surface of the third interlayer insulating film, covering the third interlayer insulating film and the plurality of third-layer metal dummy patterns; and a plurality of fourth-layer metal dummy patterns formed on portions of an upper surface of the fourth interlayer insulating film other than the portions above the plurality of third-layer metal dummy patterns and arranged in stripes at the first intervals in the second direction, and in the semiconductor device of the tenth aspect, each of the plurality of fourth-layer metal dummy patterns extends in the first direction, a geometric center of each of the plurality of fourth-layer metal dummy patterns in the first direction coincides with that of a corresponding one of the plurality of second-layer metal dummy patterns in the first direction, the plurality of third-layer metal dummy patterns and the plurality of fourth-layer metal dummy patterns are arranged at the second interval in the third direction, and a width of each of the plurality of fourth-layer metal dummy patterns in the second direction is equal to that of each of the plurality of first-layer metal dummy patterns in the second direction.

According to an eleventh aspect of the present invention, the semiconductor device comprises: a semiconductor substrate; a lower interconnection layer formed on an upper surface of the semiconductor substrate; an upper interconnection layer formed on an upper surface of the lower interconnection layer; an inductor formed in the upper interconnection layer, having a central portion which is an empty region; and a metal dummy pattern formed only in a portion of the lower interconnection layer positioned immediately below the empty region of the inductor.

According to a twelfth aspect of the present invention, the semiconductor device of the eleventh aspect further comprises: a metal guard ring formed in an outer peripheral region of the inductor inside the upper interconnection layer.

According to a thirteenth aspect of the present invention, in the semiconductor device of the twelfth aspect, the metal guard ring is grounded.

The semiconductor device of the first aspect of the present invention can produce an effect of uniformizing the deterioration in characteristics of the MOS-structure transistors caused by the metal dummy pattern while maintaining the essential effect (planarization) of the metal CMP.

The semiconductor device of the second aspect of the present invention can produce an effect of uniformizing the deterioration in characteristics of the MOS-structure transistors caused by a plurality of second-layer metal dummy patterns even when the second-layer metal dummy patterns are provided.

The semiconductor device of the third aspect of the present invention can produce an effect of uniformizing the deterioration in characteristics of the MOS-structure transistors caused by a plurality of third-layer metal dummy patterns even when the third-layer metal dummy patterns are provided.

The semiconductor device of the fourth aspect of the present invention can produce an effect of uniformizing the deterioration in characteristics of the MOS-structure transistors caused by a plurality of fourth-layer metal dummy patterns even when the fourth-layer metal dummy patterns are provided.

The semiconductor device of the fifth aspect of the present invention can produce an effect of improving noise immunity by shielding the gate electrode with the metal pattern.

The semiconductor device of the sixth aspect of the present invention can produce an effect of reducing the deterioration in drain currents caused by providing the metal dummy pattern.

The semiconductor device of the seventh aspect of the present invention can produce an effect of uniformizing the deterioration in characteristics of the resistive elements caused by a plurality of metal dummy patterns while maintaining the essential effect (planarization) of the metal CMP.

The semiconductor device of the eighth aspect of the present invention can produce an effect of uniformizing the deterioration in characteristics of the resistive elements caused by a plurality of second-layer metal dummy patterns even when the second-layer metal dummy patterns are provided.

The semiconductor device of the ninth aspect of the present invention can produce an effect of uniformizing the deterioration in characteristics of the resistive elements caused by a plurality of third-layer metal dummy patterns even when the third-layer metal dummy patterns are provided.

The semiconductor device of the tenth aspect of the present invention can produce an effect of uniformizing the deterioration in characteristics of the resistive elements caused by a plurality of fourth-layer metal dummy patterns even when the fourth-layer metal dummy patterns are provided.

The semiconductor device of the eleventh aspect of the present invention can produce an effect of preventing effectively the deterioration in characteristics of the inductor from being caused by the presence of parasitic capacitance.

The semiconductor device of the twelfth aspect of the present invention can produce an effect of preventing effectively the deterioration in characteristics of the elements outside the inductor and preventing effectively the deterioration in planeness obtained by the CMP.

The semiconductor device of the thirteenth aspect of the present invention can produce an effect of electrically shielding the inductor.

An object of the present invention is to provide a structure of metal dummy patterns which can suppress nonuniformity in characteristics of a plurality of elements as much as possible while maintaining the essential effect of the metal CMP (planeness).

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view schematically showing a semiconductor device in accordance with a first preferred embodiment of the present invention;

FIG. 5 is a plan view schematically showing a semiconductor device in accordance with a third preferred embodiment of the present invention;

DESCRIPTION OF THE PREFERRED EMBODIMENTS (The First Preferred Embodiment)

The above-discussed sixth background art reports that deterioration in drain currents is more pronounced in a case where a metal dummy pattern nonuniformly covers a source-side portion in an upper layer of a gate electrode of a transistor than in a case where a metal dummy pattern nonuniformly covers a drain-side portion.

Figure 2:
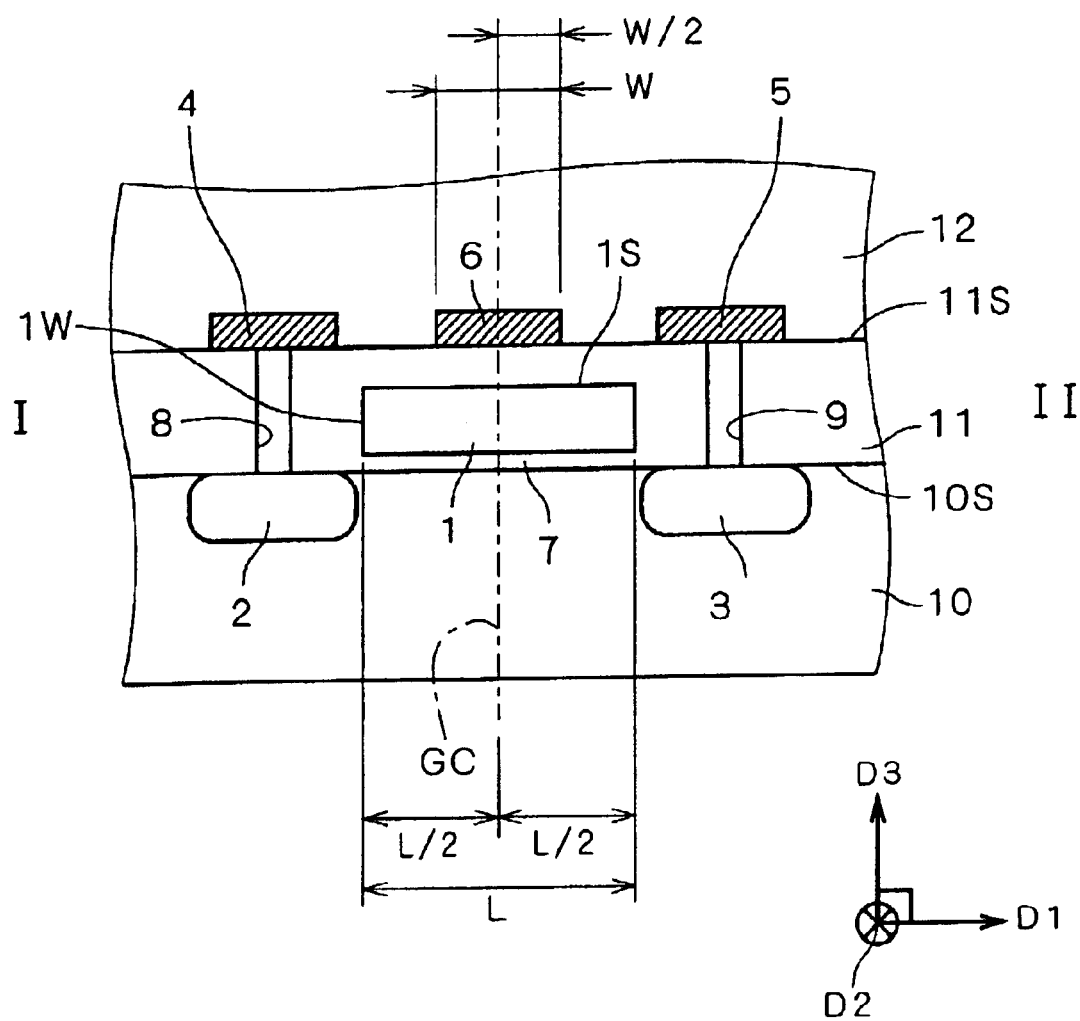
FIG. 2 is a vertical cross section schematically showing the semiconductor device in accordance with the first preferred embodiment of the present invention.

Then, the first preferred embodiment proposes that a metal dummy pattern having an arrangement shown in FIGS. 1 and 2 should be provided.

FIG. 1 is a plan view showing a plurality of MOS-structure transistors (herein MOSFETs) in accordance with the first preferred embodiment of the present invention. FIG. 2 is a vertical cross section showing any one of a plurality of MOSFETs, taken along a line I—I of FIG. 1.

As shown in FIGS. 1 and 2, a MOSFET is formed on a main surface 10S of a semiconductor substrate 10. The MOSFET comprises (i) a source or a source region (also referred to as "a first main electrode region) 2 formed extending from the main surface 10S to the inside of the semiconductor substrate 10, (ii) a drain or a drain region (also referred to as "a second main electrode region) 3 formed extending from the main surface 10S to the inside of the semiconductor substrate 10, (iii) a gate insulating film 7 formed on a portion between the source 2 and the drain 3 in the main surface 10S, (iv) a gate electrode 1 formed on an upper surface of the gate insulating film 7, for controlling main currents flowing between the first main electrode region 2 and the second main electrode region 3. The gate electrode 1 has a relatively long gate length (L) of e.g., about 10 µm and the first main electrode region 2 and the second main electrode region 3 are opposed to each other in a first direction D1 which corresponds to a direction of gate length or a direction of main current flow. Moreover, the first main electrode region 2, the second main electrode region 3 and the gate electrode 1 extend in a second direction D2 perpendicular to the first direction D1, which corresponds to a direction of gate width of the gate electrode 1.

Further, a (first) interlayer insulating film 11 covering the MOS-structure transistor (MOSFET) is formed on the main surface 10S, an upper surface 1S and side surfaces 1W of the gate electrode 1. A source contact hole 8 and a drain contact hole 9 are formed in the interlayer insulating film 11. Both the contact holes 8 and 9 are filled with metal plugs (not shown).

Furthermore, a metal dummy pattern 6 made of aluminum film, having a width W(<L) in the first direction D1, is formed on a portion of an upper surface 11S of the interlayer insulating film 11 immediately above the upper surface 1S of the gate electrode 1. Moreover, the metal dummy pattern 6 extends in the second direction D2 and its length in the second direction D2 is longer than the length of the source 2 and the drain 3 in the second direction D2. A first-layer metal (1AL) or a source electrode 4 made of aluminum film is formed on a portion of the upper surface 11S of the interlayer insulating film 11 immediately above the source 2 and on the other hand, a first-layer metal (1AL) or a drain electrode 5 made of aluminum film is formed on a portion of the upper surface 11S of the interlayer insulating film 11 immediately above the drain 3. The thickness of the metal dummy pattern 6 in a third direction or a direction of depth D3 (perpendicular to the first direction D1 and the second direction D2) is almost equal to those of these first-layer metals (1AL) 4 and 5. Specifically, the size of the metal dummy pattern 6 is determined so that a pattern density in a region immediately above the gate electrode 1 which is sandwiched between these first-layer metals (1AL) 4 and 5 may become not less than a predetermined value.

On the upper surface 11S of the interlayer insulating film 11 formed is a second interlayer insulating film 12 covering the metal dummy pattern 6 and the first-layer metals (1AL) 4 and 5.

The characteristic feature of the first preferred embodiment lies in an arrangement position of the metal dummy pattern 6 relative to the gate electrode 1. Specifically, in the first preferred embodiment, a geometric center or a central plane GC of the gate electrode 1 in the second direction D2 (a plane parallel to the second direction D2 including a central axis of the gate electrode 1 in the first direction D1) coincides with a geometric center or a central plane of the metal dummy pattern 6 in the second direction D2. With such an arrangement, the shape of the metal dummy pattern 6 becomes symmetrical in the first direction D1, as viewed from a central portion of the gate electrode 1.

By maintaining the symmetry of the metal dummy pattern 6, the metal dummy pattern 6 uniformly has an effect of deterioration in transistor characteristics on the MOSFETs. This makes the deterioration in characteristics of the transistors uniform while maintaining an essential effect of the metal CMP (planarization).

(The Second Preferred Embodiment)

The second preferred embodiment relates to an improvement of the semiconductor device of the first preferred embodiment, and more specifically, relates to a technique of further providing second-layer metal dummy patterns above a plurality of MOSFETs of the first preferred embodiment. Hereafter, the second preferred embodiment will be discussed, referring to FIGS. 3 and 4.

Figure 3:
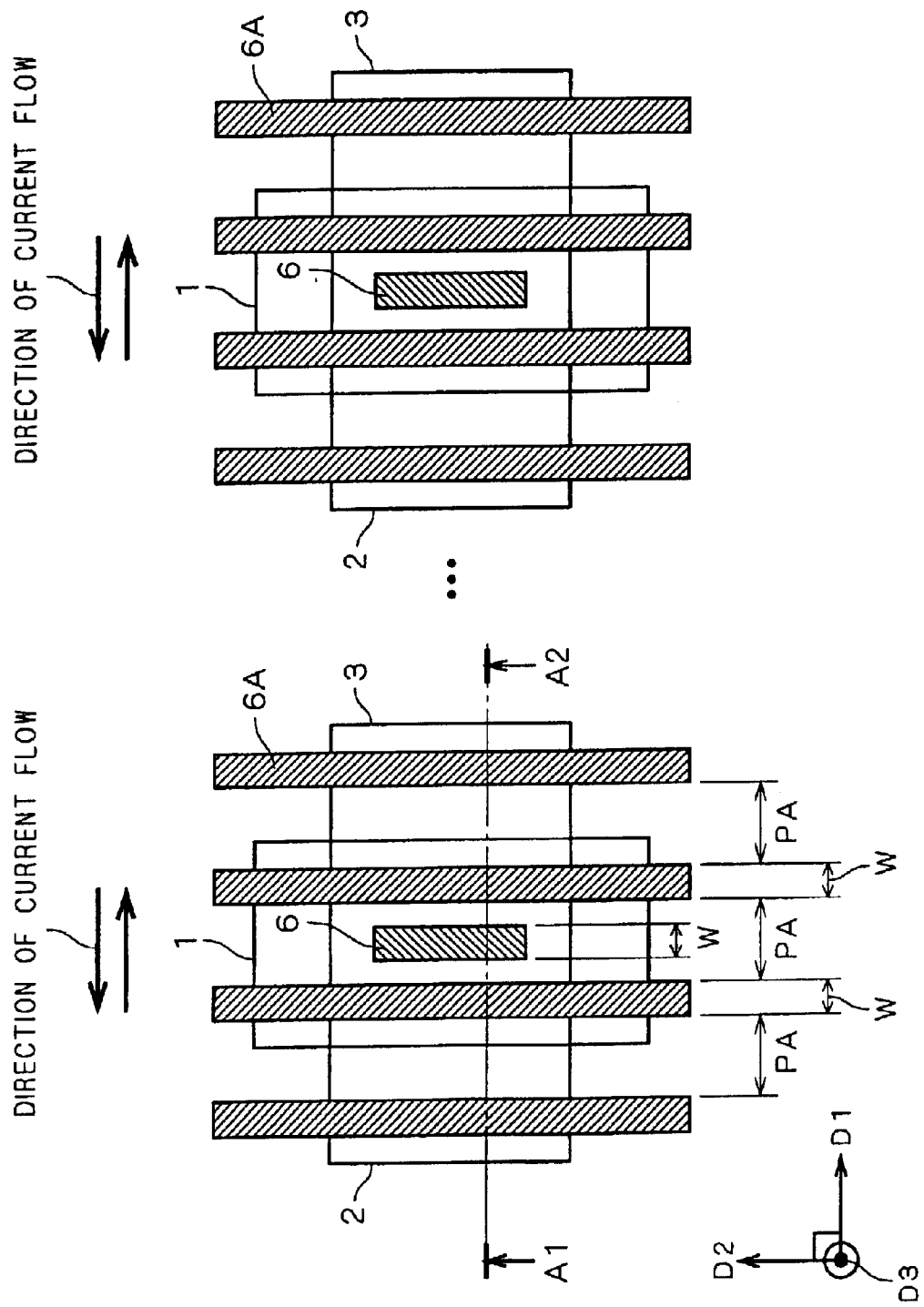
FIG. 3 is a plan view schematically showing a semiconductor device in accordance with a second preferred embodiment of the present invention.
Figure 4:
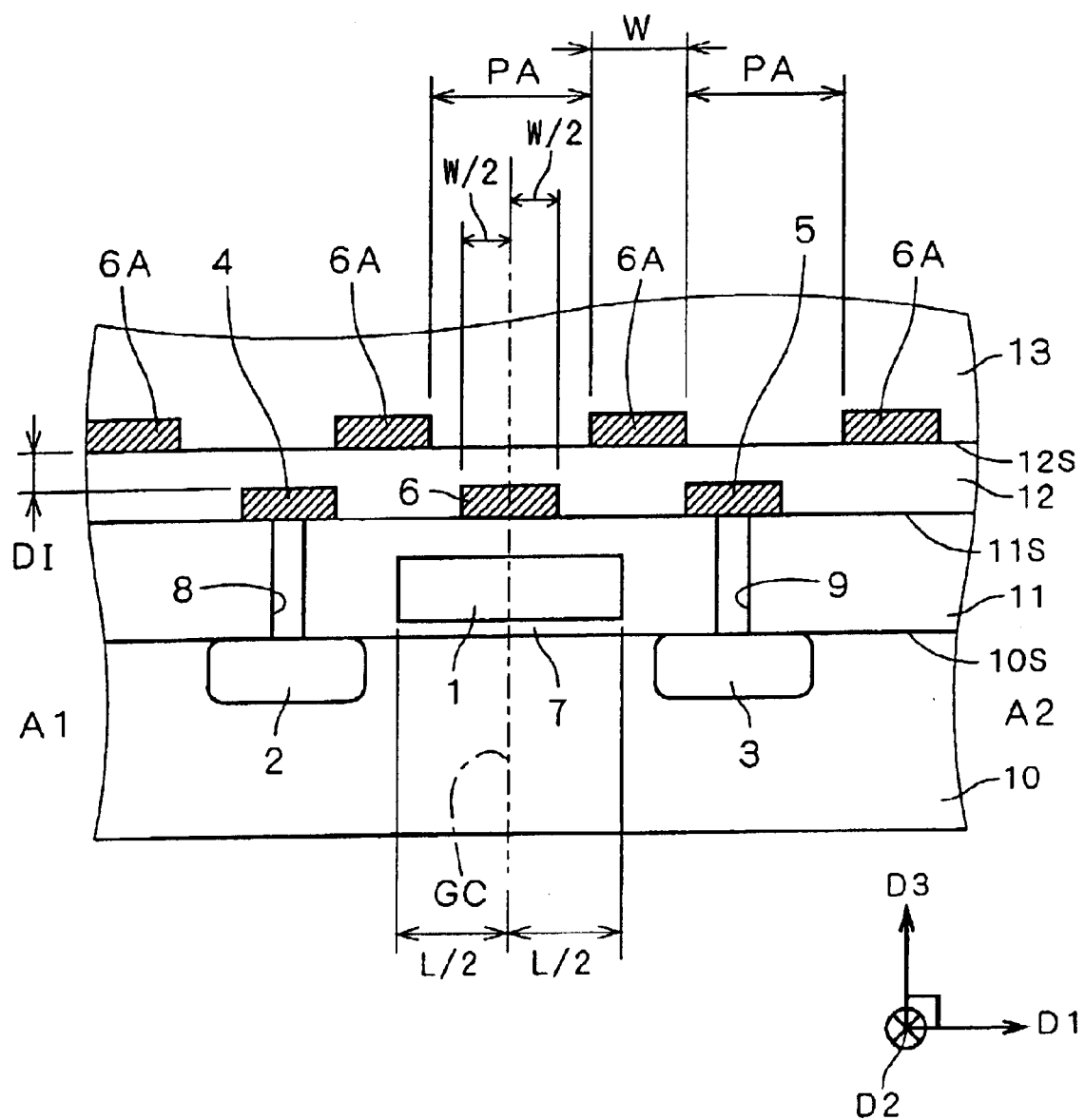
FIG. 4 is a vertical cross section schematically showing the semiconductor device in accordance with the second preferred embodiment of the present invention.

FIG. 3 is a plan view showing a plurality of MOS-structure transistors (herein MOSFETs) in accordance with the second preferred embodiment of the present invention. FIG. 4 is a vertical cross section showing any one of a plurality of MOSFETs, taken along a line A1–A2 of FIG. 3. Reference signs in FIGS. 3 and 4 identical to those in FIGS. 1 and 2 represent constituent elements identical to those of the first preferred embodiment.

As shown FIGS. 3 and 4, in a case of MOSFET, since the first-layer metal (1AL) is used for a portion of connecting the gate electrode 1 and a gate terminal (not shown), a portion of connecting the source 2 and a source terminal 4, a portion of connecting the drain 3 and a drain terminal 5 and a first-layer metal dummy pattern 6, a plurality of second-layer metal dummy patterns 6A arranged in stripes are provided above the first-layer metal (1AL). Specifically, each of the second-layer metal dummy patterns 6A is a pattern made of second-layer aluminum film (2AL), having a width W, and moreover extends in a direction inclined at 90 degrees relative to (perpendicular to) the direction D1 of gate length or current flow on transistors. Further, the metal dummy patterns 6A are arranged at predetermined intervals PA in the direction D1. A structure in which the second-layer metal dummy patterns 6A are arranged in stripes will be discussed in details below.

On the upper surface 11S of the first interlayer insulating film 11 formed is the second interlayer insulating film 12 covering the first interlayer insulating film 11, the first-layer metals 4 and 5 and the first-layer metal dummy pattern 6.

Next, a plurality of second-layer metal dummy patterns 6A arranged in stripes at the first intervals PA (>W, <L) in the first direction D1 are formed on portions of an upper surface 12S of the second interlayer insulating film 12 other than a portion above the first-layer metal dummy pattern 6 and portions above the first-layer metals 4 and 5. Moreover, each of the second-layer metal dummy patterns 6A extends in the second direction D2 and the first-layer metal dummy pattern 6 and the second-layer metal dummy patterns 6A are arranged at a second interval D1 in the third direction D3. The width of each of the second-layer metal dummy patterns 6A in the first direction D1 is almost equal to the width W of the first-layer metal dummy pattern 6 in the first direction D1. The thickness of each of the second-layer metal dummy patterns 6A in the third direction D3 is almost equal to that of the first-layer metal dummy pattern 6.

Further, on the upper surface 12S of the second interlayer insulating film 12 formed is a third interlayer insulating film 13 covering a plurality of second-layer metal dummy patterns 6A.

Such an arrangement of the second-layer metal dummy patterns 6A in stripes makes the effect of the second-layer metal dummy patterns 6A on characteristics of the MOSFETs uniform.

(The Third Preferred Embodiment)

The third preferred embodiment relates to a further improvement of the semiconductor device of the first preferred embodiment, and more specifically, relates to a technique of further providing metal dummy patterns in the third layer and more layers above a plurality of MOSFETs of the second preferred embodiment. Hereafter, the third preferred embodiment will be discussed, referring to FIGS. 5 and 6.

Figure 6:
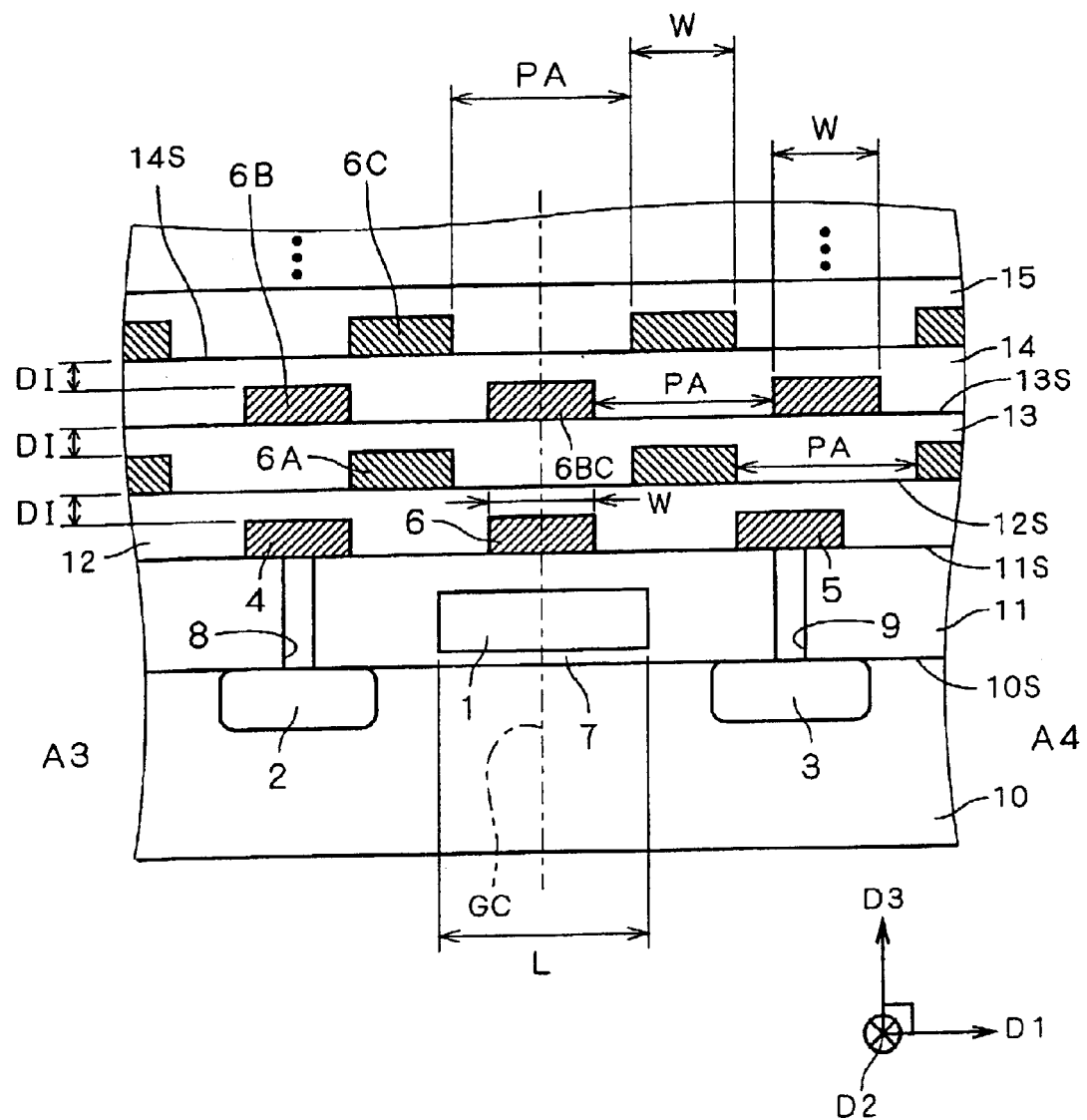
FIG. 6 is a vertical cross section schematically showing the semiconductor device in accordance with the third preferred embodiment of the present invention.

FIG. 5 is a plan view showing a plurality of MOS-structure transistors (herein MOSFETs) in accordance with the third preferred embodiment of the present invention. FIG. 6 is a vertical cross section showing any one of a plurality of MOSFETs, taken along a line A3–A4 of FIG. 5. Reference signs in FIGS. 5 and 6 identical to those in FIGS. 3 and 4 represent constituent elements identical to those of the second preferred embodiment.

As shown in FIGS. 5 and 6, in the third preferred embodiment, metal dummy patterns in the n-th (n is an integer not less than three) layer are formed extending in the second direction D2 perpendicular to the first direction D1 of current flow and arranged at the first intervals PA in the first direction D1, to form a plurality of n-th layer metal dummy patterns in stripes. The first interval PA depends on design rules of layout design. Moreover, in the third preferred embodiment, the metal dummy patterns in the respective layers are layered alternately staggered in the first direction DI so that the n-th layer metal dummy patterns may overlap neither the (n−1)-th layer metal dummy patterns nor the (n+1)-th layer metal dummy patterns, and in other words, the (n−1)-th layer metal dummy patterns and the (n+1)-th layer metal dummy patterns may overlap each other and the n-th layer metal dummy patterns and the (n+2)-th layer metal dummy patterns may overlap each other, as viewed from upper, and the metal dummy patterns in the second layer and the higher-level layers form a staggered pattern, as shown in the cross section of FIG. 6. A structure in which a plurality of third-layer metal dummy patterns 6B arranged in stripes and a plurality of fourth-layer metal dummy patterns 6C arranged in stripes are provided will be discussed in details below.

On the upper surface 12S of the second interlayer insulating film 12 formed is the third interlayer insulating film 13 covering the second interlayer insulating film 12 and a plurality of second-layer metal dummy patterns 6A arranged in stripes.

Next, a plurality of third-layer metal dummy patterns 6B arranged in stripes at the first intervals PA in the first direction D1 are formed on portions of an upper surface 13S of the third interlayer insulating film 13 other than portions above the second-layer metal dummy patterns 6A. Each of the third-layer metal dummy patterns 6B extends in the second direction D2, and a metal dummy pattern 6BC out of a plurality of third-layer metal dummy patterns 6B is positioned above the first-layer metal dummy pattern 6. Moreover, a geometric center of the metal dummy pattern 6BC coincides with the geometric center of the first-layer metal dummy pattern 6, and accordingly coincides with the geometric center of the gate electrode 1. Further, the width of each of the third-layer metal dummy patterns 6B in the first direction D1 is almost equal to the width W of the first-layer metal dummy pattern 6 in the first direction D1. Furthermore, the interval between the second-layer metal dummy patterns 6A and the third-layer metal dummy patterns 6B in the third direction D3 is equal to the second interval D1.

Further, on the upper surface 13S of the third interlayer insulating film 13 formed is a fourth interlayer insulating film 14 covering the third interlayer insulating film 13 and a plurality of third-layer metal dummy patterns 6B arranged in stripes.

Furthermore, a plurality of fourth-layer metal dummy patterns 6C arranged in stripes at the first intervals PA in the first direction D1 are formed on portions of an upper surface 14S of the fourth interlayer insulating film 14 other than portions above the third-layer metal dummy patterns 6B. Each of the fourth-layer metal dummy patterns 6C extends in the second direction D2. Moreover each of the fourth-layer metal dummy patterns 6C is positioned above a corresponding one of the second-layer metal dummy patterns 6A, and geometric centers of these metal dummy patterns 6A and 6C facing each other coincide with each other. The width of each of the fourth-layer metal dummy patterns 6C in the first direction D1 is almost equal to the width W of the first-layer metal dummy pattern 6 in the first direction D1. Further, the interval between the third-layer metal dummy patterns 6B and the fourth-layer metal dummy patterns 6C in the third direction D3 is equal to the second interval D1.

On the upper surface 14S of the fourth interlayer insulating film 14 formed is a fifth interlayer insulating film 15 covering the fourth interlayer insulating film 14 and a plurality of fourth-layer metal dummy patterns 6C arranged in stripes, and metal dummy patterns (not shown) having the same patterns as the third-layer metal dummy patterns 6B are formed on an upper surface of the fifth interlayer insulating film 15.

On upper surfaces of higher-level interlayer insulating films, metal dummy patterns having the same patterns as the second-layer metal dummy patterns 6A and those having the same patterns as the third-layer metal dummy patterns 6B are alternately formed.

Thus, in the above-discussed multilayer metal dummy pattern structure, the interval between metal dummy patterns arranged adjacently to each other in the third direction D3 is constant and this makes an effect of the multilayer metal dummy pattern structure on characteristics of the MOSFETs uniform.

(The Fourth Preferred Embodiment)

The fourth preferred embodiment relates to an application of the semiconductor device of the first preferred embodiment. Specifically, in the fourth preferred embodiment, the metal dummy pattern described in the first preferred embodiment is applied to a MOS transistor M2 shown in FIG. 12.5(a) on page 285 of the seventh background art ("Analog Integrated Circuit Design Technology for VLSI (II)", by P. R. Gray & R. G. Mayer, supervised in translation by Minoru Nagata, translated by Fujio Nakahara and others, pp. 284–288, 12.2.2, "MOS Transistor Constant Current Circuit", 1990) and the structure of the metal dummy pattern is modified. Characteristic features and advantages of the fourth preferred embodiment will be discussed, referring to FIGS. 7 to 9.

Figure 7:
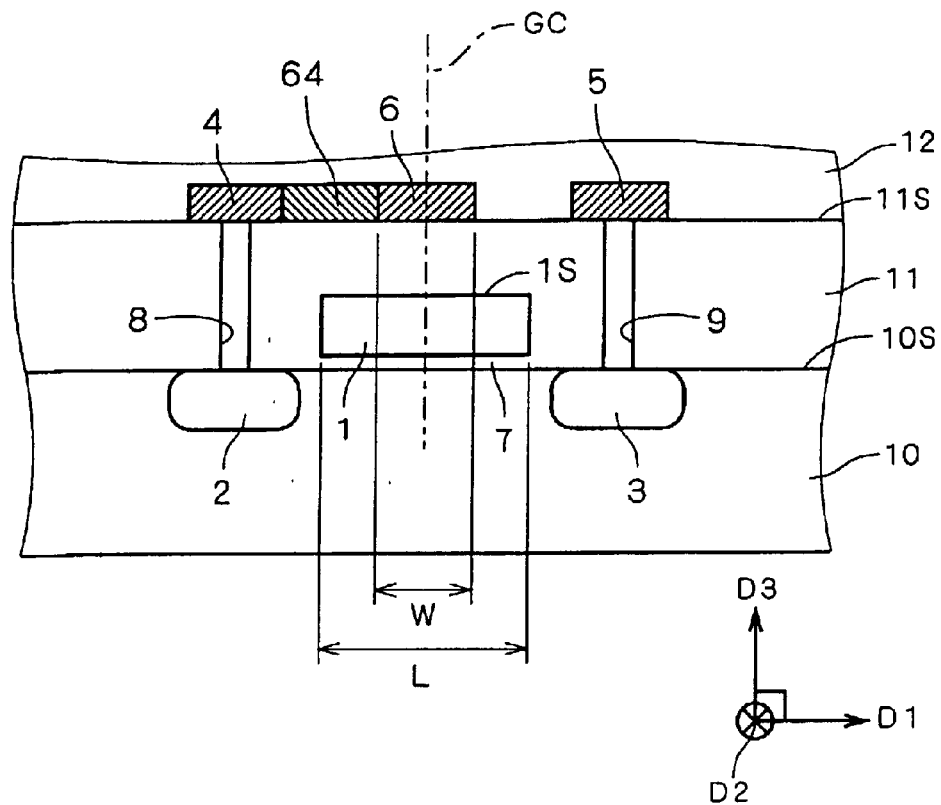
FIG. 7 is a vertical cross section schematically showing a semiconductor device in accordance with a fourth preferred embodiment of the present invention.

FIG. 7 is a vertical cross section showing a semiconductor device in accordance with the fourth preferred embodiment of the present invention, and reference signs in FIG. 7 identical to those in FIG. 2 represent constituent elements identical to those of the first preferred embodiment. As shown in FIG. 7, the metal dummy pattern 6 is connected to the source 2 whose potential is fixed to a predetermined value through a connecting metal layer (1AL) 64, the first-layer metal 4 and a metal inside the contact hole 8 (not shown). Thus, in the fourth preferred embodiment, the metal dummy pattern 6 provided above the gate electrode of a single transistor is connected to the source-side portion 2 whose potential is fixed, by using like metals, to fix a potential of the metal dummy pattern 6 to the predetermined value. With this structure, the gate electrode 1 is shielded by the metal dummy pattern 6 and it thereby becomes possible to suppress an effect of external noises on characteristics of the transistors (improvement in noise immunity)

Figure 8:
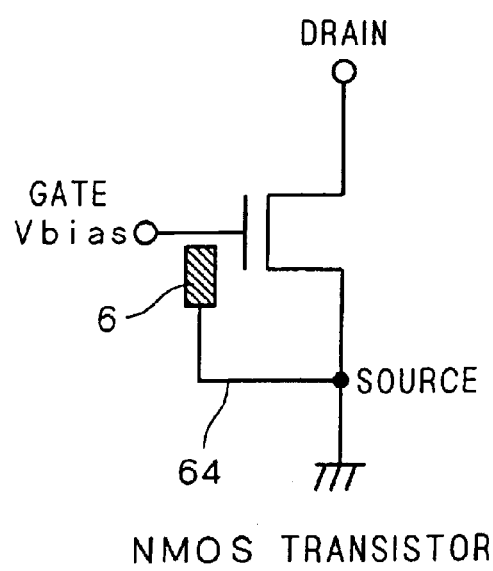
FIG. 8 is a circuit diagram schematically showing an NMOSFET in accordance with the fourth preferred embodiment of the present invention.
Figure 9:
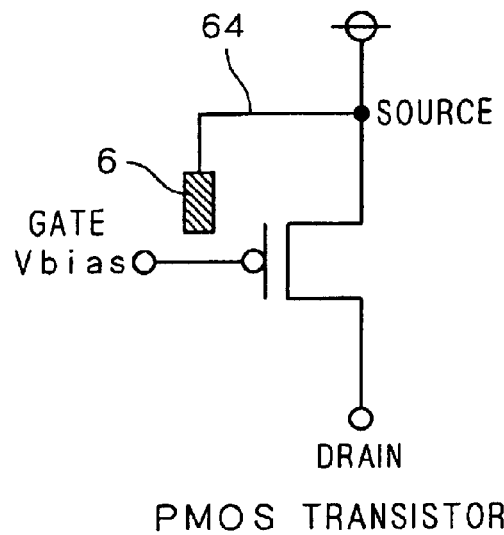
FIG. 9 is a circuit diagram schematically showing a PMOSFET in accordance with the fourth preferred embodiment of the present invention.

FIG. 8 is a schematic circuit diagram showing an application of the fourth preferred embodiment to a single transistor as an NMOSFET, and FIG. 9 is a schematic circuit diagram showing an application of the fourth preferred embodiment to a single transistor as a PMOSFET. The single transistor of the fourth preferred embodiment is widely used as part of a constant current source circuit.

Further, the connecting metal layer (1AL) 64 may have a structure in which part of the metal dummy pattern 6 is electrically connected to the first-layer metal 4.

(The Fifth Preferred Embodiment)

The fifth preferred embodiment relates to an application of the semiconductor device of the first preferred embodiment. Specifically, in the fifth preferred embodiment, the metal dummy pattern described in the first preferred embodiment is applied to a MOS transistor in a current source circuit of cascode connection shown in FIG. 12.7 on page 288 of the above-mentioned seventh background art and the structure of the metal dummy pattern is modified. Characteristic features and advantages of the fifth preferred embodiment will be discussed, referring to FIG. 10.

In a constant current source circuit consisting of a plurality of single transistors, since the gate length of the transistor used therein is set long, it is advantageous for planarization effect of the CMP to provide the metal dummy pattern above the gate electrode of each of the transistors. The sixth background art, however, reports that deterioration in drain currents is more pronounced in a case where the metal dummy pattern covers a source-side portion within a range above the gate electrode of the transistor. Then, in the fifth preferred embodiment, the metal dummy pattern 6 of the first preferred embodiment is provided above a gate electrode of a transistor operating as a constant current source circuit and the metal dummy pattern 6 is electrically connected to a drain-side portion of the transistor, to reduce the deterioration in drain currents as compared with the fourth preferred embodiment.

Figure 10:
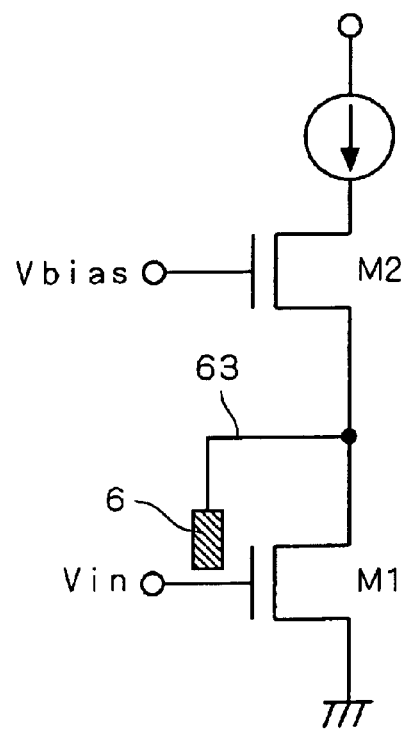
FIG. 10 is a circuit diagram schematically showing a semiconductor device in accordance with a fifth preferred embodiment of the present invention.

FIG. 10 is a circuit diagram showing an application of a structure of the fifth preferred embodiment to a lower transistor in a constant current source circuit of cascode connection. As shown in FIG. 10, the metal dummy pattern 6 of a lower transistor M1 as an NMOSFET is electrically connected to a drain-side portion of the transistor M1 or a source-side portion of an upper transistor M2 through a connecting metal layer (1AL) 63. Such a connection allows reduction of deterioration in drain currents as compared with the fourth preferred embodiment while maintaining the planarization effect of the CMP. Moreover, since the impedance of the source-side portion of the upper transistor M2 is the lowest but that of the source-side portion of the lower transistor M1 in comparison with that of the drain-side portion of the upper transistor M2, a shield effect can be expected at the same time though the effect is smaller than that of the fourth preferred embodiment.

Further, the fifth preferred embodiment can be applied to a differential folded cascode amplifier shown in FIG. 10 of page 853 of the eighth background art (Microelectronic Circuits, by Adel S. Sedra & Kenneth C. Smith, pp. 882–854, "The Folded-Cascode CMOS Op Amp", 1998). Such a variation is shown in FIG. 11.

Figure 11:
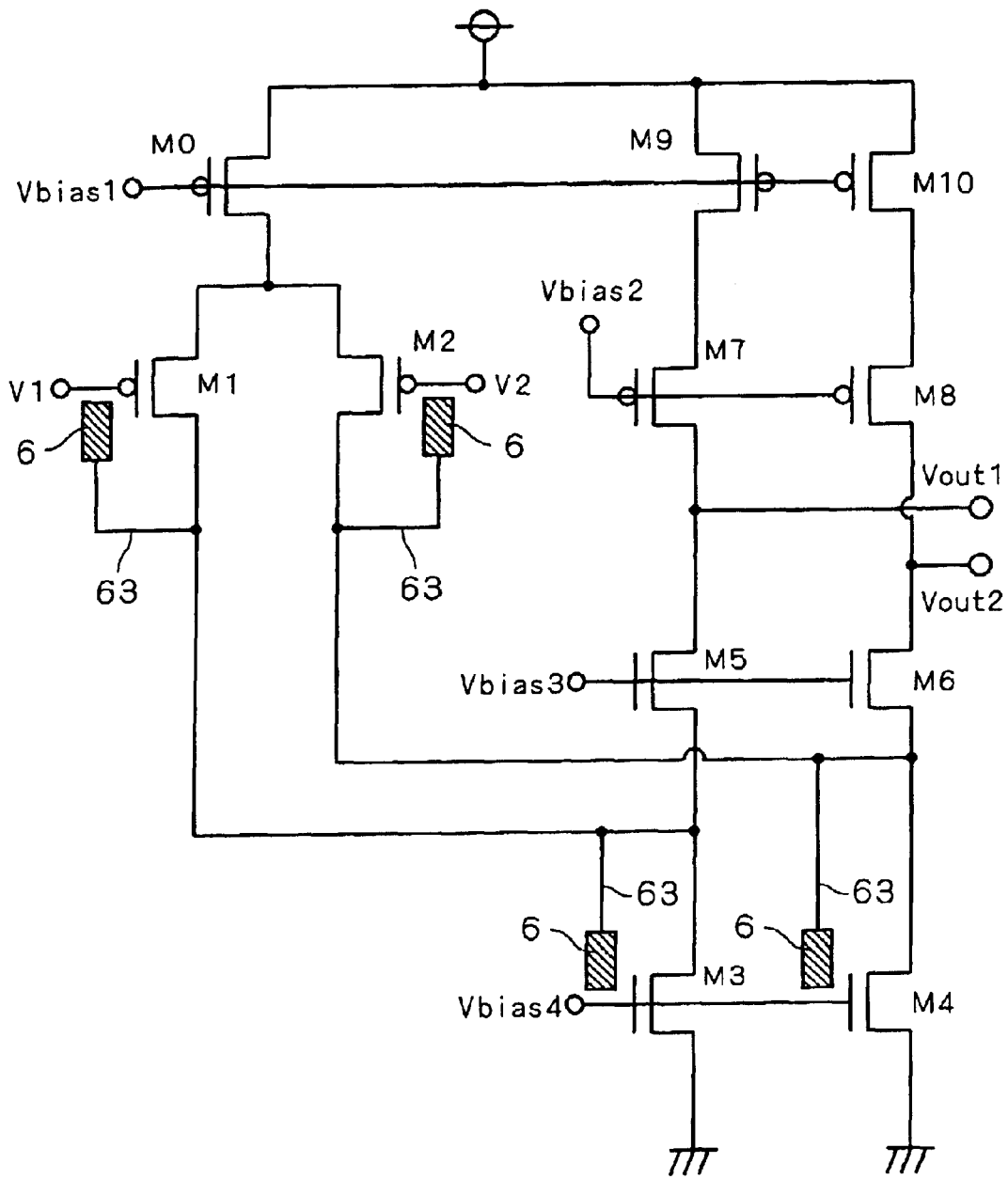
FIG. 11 is a circuit diagram schematically showing a semiconductor device in accordance with a variation of the fifth preferred embodiment of the present invention.

In a circuit of FIG. 11, since four single transistors M1 to M4 must be of good matching, those having long gate length are used for the transistors M1 to M4. Then, in the present variation, the metal dummy patterns 6, each of which is described in the first preferred embodiment, are provided on portions above respective gate electrodes of the transistors M1 to M4 and are electrically connected to the drain-side portions of the corresponding transistors M1 to M4 through the connecting metal layers (1AL) 63. With such a connection, the deterioration in drain currents is reduced as compared with the case where the respective metal dummy patterns 6 provided correspondingly to the transistors M1 to M4 are connected to the respective source-side portions thereof, as well as the metal dummy patterns 6 can contribute to the planarization obtained by the CMP technique. Moreover, since source-side portions of transistors M5 and M6 or the drain-side portions of the transistors M1 to M4 have low impedance, the shield effect can be effected.

(The Sixth Preferred Embodiment)

The sixth preferred embodiment relates to a technique of providing a plurality of metal dummy patterns (the first layer) made of aluminum film above resistive elements such as a diffused resistor or a polysilicon resistor. A structure of a semiconductor device in accordance with the sixth preferred embodiment will be discussed below, referring to FIGS. 12 to 14.

Figure 12:
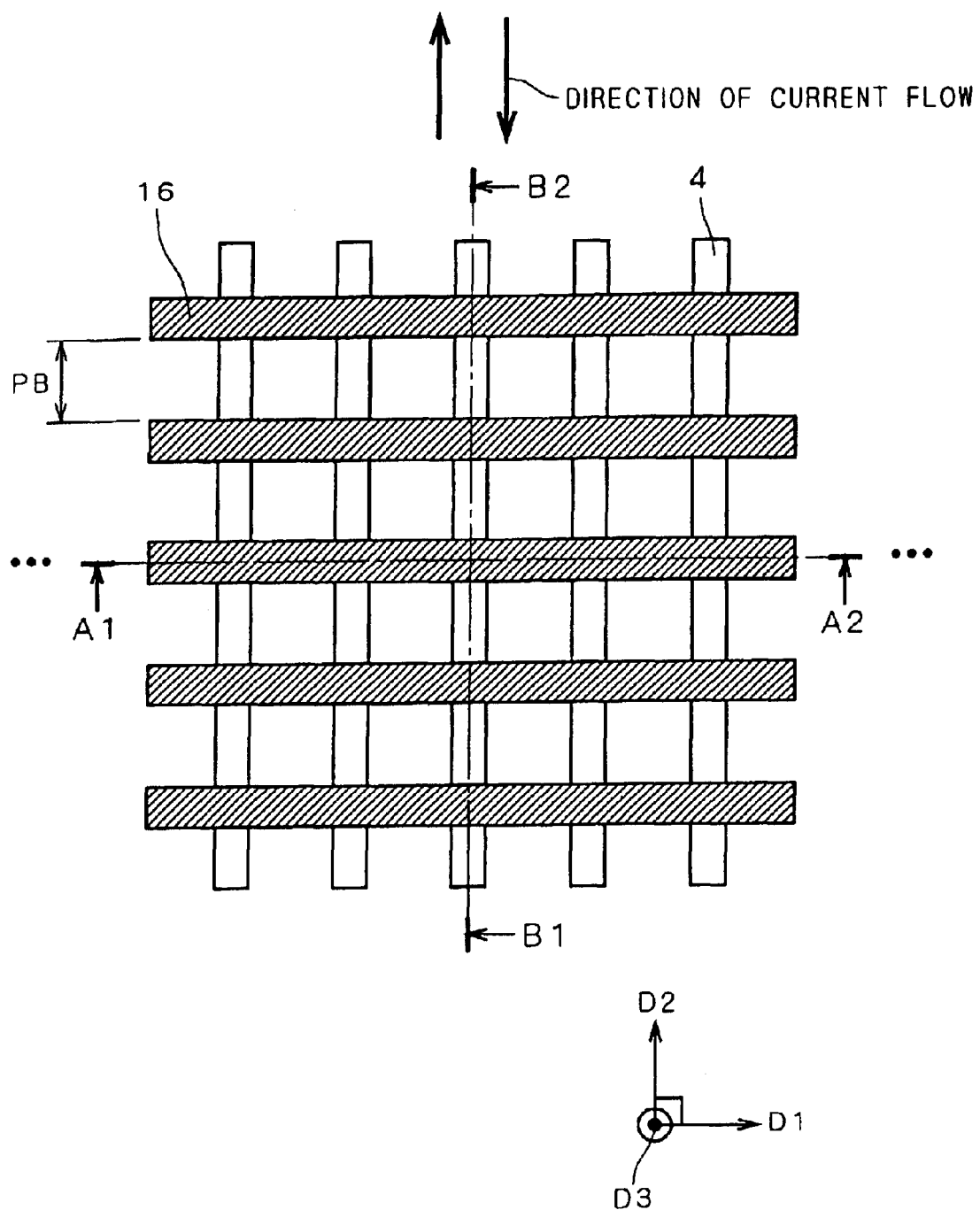
FIG. 12 is a plan view schematically showing a semiconductor device in accordance with a sixth preferred embodiment of the present invention.
Figure 13:
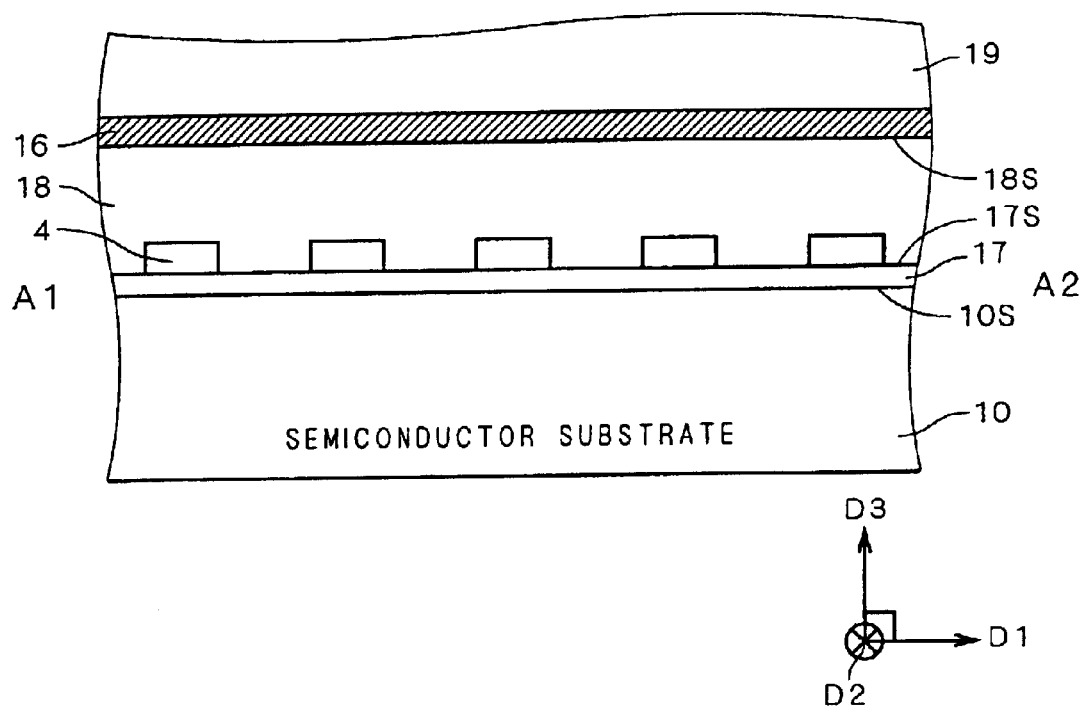
FIGS. 13 and 14 are vertical cross sections schematically showing the semiconductor device in accordance with the sixth preferred embodiment of the present invention.

FIG. 12 is a plan view schematically showing a plurality of metal dummy patterns in the semiconductor device in accordance with the sixth preferred embodiment of the present invention. FIG. 13 is a vertical cross section taken along a line A1–A2 of FIG. 12 extending in the first direction D1 perpendicular to a direction of current flow, and FIG. 14 is a vertical cross section taken along a line B1–B2 of FIG. 12 parallel to the direction D2 of current flow.

Figure 14:
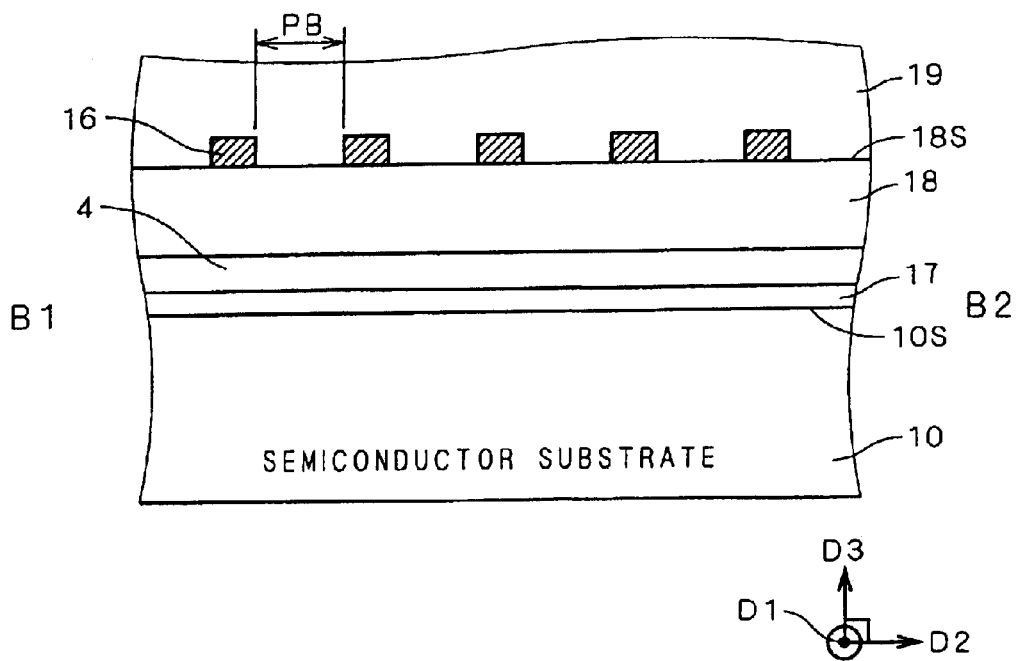

As shown in FIGS. 12 to 14, an insulating film 17 is formed on the main surface 10S of the semiconductor substrate 10, and on an upper surface 17S of the insulating film 17 formed are a plurality of resistive elements 4 arranged in the first direction D1. Each of the resistive elements 4 extends in the second direction D2.

Further, on the upper surface 17S of the insulating film 17 formed is a (first) interlayer insulating film 18 covering the insulating film 17 and a plurality of resistive elements 4, and on an upper surface 18S of the interlayer insulating film 18 formed are a plurality of metal dummy patterns 16 arranged in stripes at first intervals PB in the second direction D2. Each of the metal dummy patterns 16 extends in the first direction D1. Further, the first interval PB which corresponds to a pitch of the stripes depends on design rules of layout design.

If a plurality of metal dummy patterns are provided in parallel to the direction D2 of current flow, depending on the degree of overlapping of the metal dummy patterns covering the resistive elements 4, effects thereof on the resistive elements 4 must become nonuniform.

The arrangement of a plurality of metal dummy patterns 16 in accordance with the sixth preferred embodiment, however, can easily make the effect of a plurality of metal dummy patterns 16 on the resistive elements 4 uniform.

(The Seventh Preferred Embodiment)

The seventh preferred embodiment relates to a technique of providing a plurality of metal dummy patterns in multiple layers above the resistive elements. A structure of a semiconductor device in accordance with the seventh preferred embodiment will be discussed below, referring to FIGS. 15 and 16.

Figure 15:
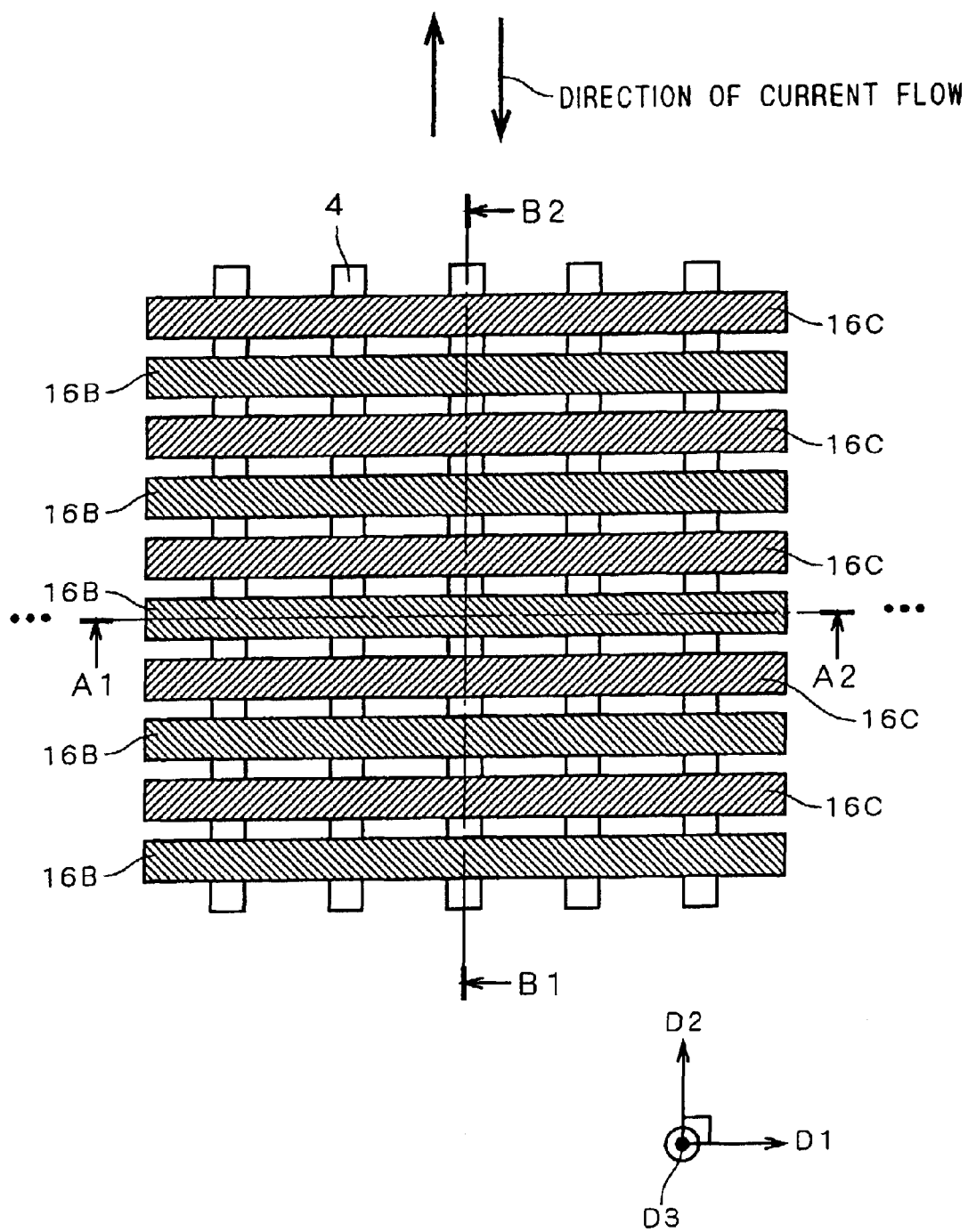
FIG. 15 is a plan view schematically showing a semiconductor device in accordance with a seventh preferred embodiment of the present invention.
Figure 16:
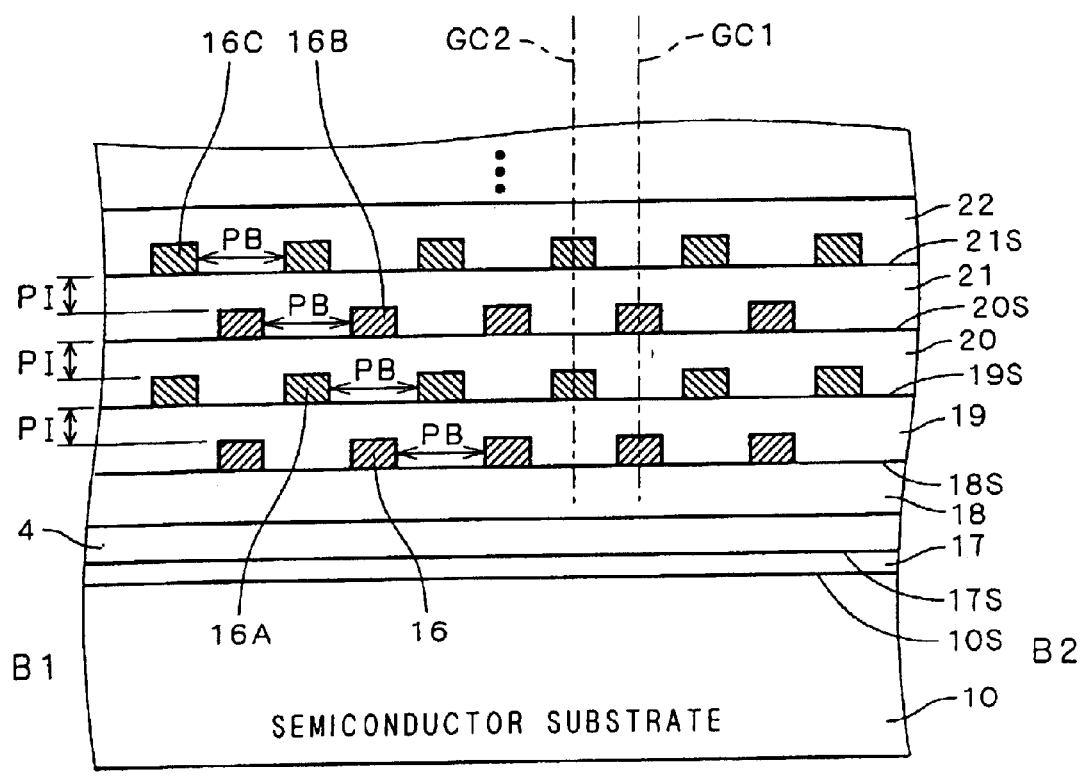
FIG. 16 is a vertical cross section schematically showing the semiconductor device in accordance with the seventh preferred embodiment of the present invention.
Figure 16:
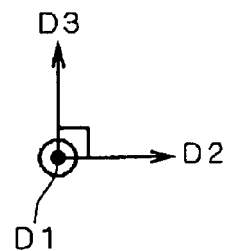

FIG. 15 is a plan view showing the semiconductor device in accordance with the seventh preferred embodiment of the present invention and FIG. 16 is a vertical cross section taken along a line B1–B2 of FIG. 15.

On the upper surface 18S of the first interlayer insulating film 18 formed is a second interlayer insulating film 19 covering the first interlayer insulating film 18 and a plurality of first-layer metal dummy patterns 16. Further, a plurality of second-layer metal dummy patterns 16A arranged in stripes at the first intervals PB in the second direction D2 are formed on portions of an upper surface 19S of the second interlayer insulating film 19 other than the portions above the first-layer metal dummy patterns 16. Moreover, each of the second-layer metal dummy patterns 16A extends in the first direction D1. Further, the first-layer metal dummy patterns 16 and the second-layer metal dummy patterns 16A are arranged at a second interval P1 in the third direction D3 perpendicular to the first direction D1 and the second direction D2. Furthermore, the width of each of the second-layer metal dummy patterns 16A in the second direction D2 is equal to that of each of the first-layer metal dummy patterns 16 in the second direction D2.

On the upper surface 19S of the second interlayer insulating film 19 formed is a third interlayer insulating film 20 covering the second interlayer insulating film 19 and a plurality of second-layer metal dummy patterns 16A. A plurality of third-layer metal dummy patterns 16B arranged in stripes at the first intervals PB in the second direction D2 are formed on portions of an upper surface 20S of the third interlayer insulating film 20 other than portions above the second-layer metal dummy patterns 16A. Moreover each of the third-layer metal dummy patterns 16B extends in the first direction D1. A geometric center of each of the third-layer metal dummy patterns 16B in the first direction D1 coincides with a geometric center GC1 of a corresponding one of the first-layer metal dummy patterns 16 in the first direction D1. Further, the second-layer metal dummy patterns 16A and the third-layer metal dummy patterns 16B are arranged at the second interval PI in the third direction D3. Additionally, the width of each of the third-layer metal dummy patterns 16B in the second direction D2 is equal to the width of each of the first-layer metal dummy patterns 16 in the second direction D2.

On the upper surface 20S of the third interlayer insulating film 20 formed is a fourth interlayer insulating film 21 covering the third interlayer insulating film 20 and a plurality of third-layer metal dummy patterns 16B. A plurality of fourth-layer metal dummy patterns 16C arranged in stripes at the first intervals PB in the second direction D2 are formed on portions of an upper surface 21S of the fourth interlayer insulating film 21 other than portions above the third-layer metal dummy patterns 16B. Each of the fourth-layer metal dummy patterns 16C extends in the first direction D1. Moreover, A geometric center of each of the fourth-layer metal dummy patterns 16C in the first direction D1 coincides with a geometric center GC2 of a corresponding one of the second-layer metal dummy patterns 16A in the first direction D1. Further, the third-layer metal dummy patterns 16B and the fourth-layer metal dummy patterns 16C are arranged at the second interval PI in the third direction D3. The width of each of the fourth-layer metal dummy patterns 16C in the second direction D2 is equal to the width of each of the first-layer metal dummy patterns 16 in the second direction D2. Furthermore, the fourth-layer metal dummy patterns 16C are covered with a fifth interlayer insulating film 22.

By providing the multi-layered metal dummy patterns as discussed above, the interval between layers becomes constant and this can make effects of the multi-layered metal dummy patterns on the resistive elements uniform.

(The Eighth Preferred Embodiment)

If an inductor is made in an upper interconnection layer, the presence of parasitic capacitance between the inductor and the metal dummy patterns formed in an lower interconnection layer on the semiconductor substrate causes deterioration in characteristics of the inductor.

Figure 17:
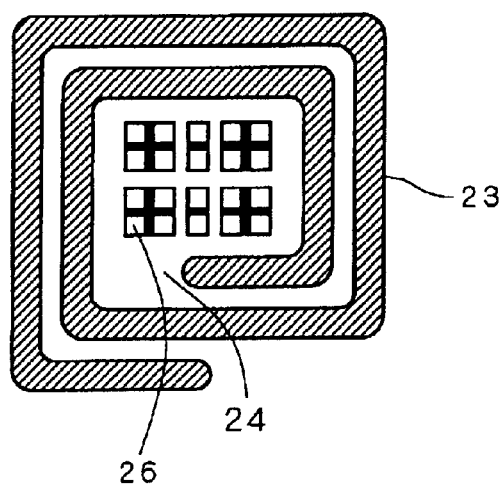
FIG. 17 is a plan view schematically showing a semiconductor device in accordance with an eighth preferred embodiment of the present invention.

Then, in the eighth preferred embodiment, as shown in the plan view of FIG. 17, no metal dummy pattern is formed in the lower interconnection layer immediately below the formation region of an inductor 23 and instead, metal dummy patterns 26 are provided only in the lower interconnection layer immediately below an empty region 24 in the central portion of the inductor 23.

Such a structure prevents the deterioration in characteristics of the inductor due to the presence of parasitic capacitance. Moreover, as compared with the case where no metal dummy pattern is formed in a region immediately below the formation region for the inductor 23 and its peripheral region, the eighth preferred embodiment ensures the planarization effect obtained by the CMP for the interlayer insulating film immediately below the formation region of the inductor 23 and its peripheral region.

(The First Variation)

Figure 18:
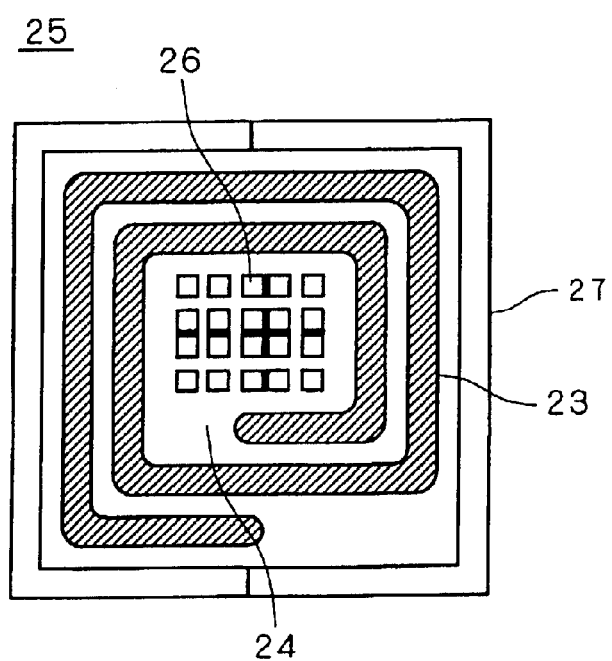
FIG. 18 is a plan view schematically showing a semiconductor device in accordance with a first variation of the eighth preferred embodiment of the present invention.

As shown in FIG. 18, a metal guard ring 27 may be so provided as to surround the inductor 23 in an outer peripheral region 25 of the formation region of the inductor 23.

By providing the metal guard ring 27, it is possible to prevent deterioration in characteristics of elements provided outside the inductor 23 and since the metal guard ring 27 serves as a metal dummy pattern, an advantage of preventing the planeness obtained by the CMP from being impaired.

(The Second Variation)

Figure 19:
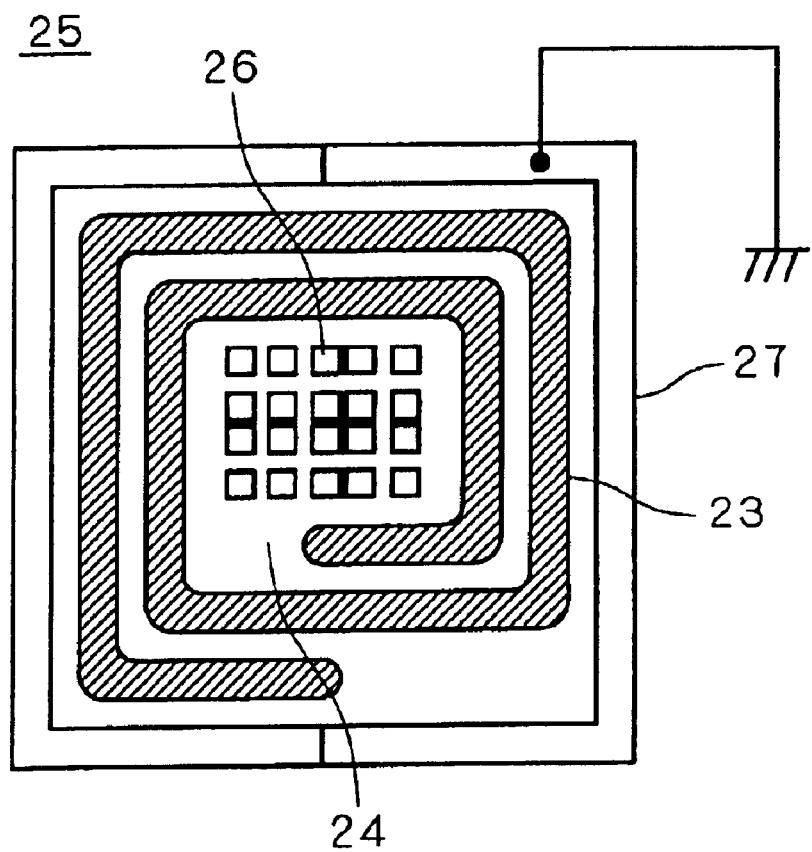
FIG. 19 is a plan view schematically showing a semiconductor device in accordance with a second variation of the eighth preferred embodiment of the present invention.

As shown in FIG. 19, a potential of the metal guard ring 27 which is provided around the inductor 23 may be fixed to the ground potential.

It thereby becomes possible to electrically shield the inductor 23.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a semiconductor substrate;
    a MOS-structure transistor formed on a main surface of said semiconductor substrate, comprising a first main electrode region, a second main electrode region and a gate electrode for controlling currents flowing between said first main electrode region and said second main electrode region;
    an interlayer insulating film formed on an upper surface of said gate electrode, covering said MOS-structure transistor; and
    a metal dummy pattern formed on an upper surface of said interlayer insulating film and positioned above said upper surface of said gate electrode,
    wherein said first main electrode region is opposed to said second main electrode region in a first direction which corresponds to a direction of gate length of said gate electrode,
    said first main electrode region, said second main electrode region, said gate electrode and said metal dummy pattern extend in a second direction perpendicular to said first direction, which corresponds to a direction of gate width of said gate electrode, and
    a geometric center of said gate electrode in said second direction coincides with a geometric center of said metal dummy pattern in said second direction.

2. The semiconductor device according to claim 1, wherein
    said first main electrode region and said second main electrode region correspond to a source and a drain, respectively,
    said metal dummy pattern is electrically connected to said source, and
    a potential of said source is fixed at a predetermined value.

3. The semiconductor device according to claim 1, wherein
    said first main electrode region and said second main electrode region correspond to a source and a drain, respectively, and
    said metal dummy pattern is electrically connected to said drain.

4. The semiconductor device according to claim 1, wherein
    said interlayer insulating film and said metal dummy pattern are defined as a first interlayer insulating film and a first-layer metal dummy pattern, respectively,
    said semiconductor device further comprising:
        a second interlayer insulating film covering said first interlayer insulating film and said first-layer metal dummy pattern; and
        a plurality of second-layer metal dummy patterns formed on portions of an upper surface of said second interlayer insulating film other than a portion above said first-layer metal dummy pattern and arranged in stripes at first intervals in said first direction,
    wherein each of said plurality of second-layer metal dummy patterns extends in said second direction,
    said first-layer metal dummy pattern and said plurality of second-layer metal dummy patterns are arranged at a second interval in a third direction perpendicular to said first direction and said second direction, and
    a width of each of said plurality of second-layer metal dummy patterns in said first direction is equal to that of said first-layer metal dummy pattern in said first direction.

5. The semiconductor device according to claim 4 further comprising:
    a third interlayer insulating film covering said second interlayer insulating film and said plurality of second-layer metal dummy patterns; and
    a plurality of third-layer metal dummy patterns formed on portions of an upper surface of said third interlayer insulating film other than portions above said plurality of second-layer metal dummy patterns and arranged in stripes at said first intervals in said first direction,
    wherein each of said plurality of third-layer metal dummy patterns extends in said second direction,
    one of said plurality of third-layer metal dummy patterns is positioned above said first-layer metal dummy pattern,
    a width of each of said plurality of third-layer metal dummy patterns in said first direction is equal to that of said first-layer metal dummy pattern in said first direction, and
    an interval between said plurality of second-layer metal dummy patterns and said plurality of third-layer metal dummy patterns in said third direction is equal to said second interval.

6. The semiconductor device according to claim 5 further comprising:
    a fourth interlayer insulating film covering said third interlayer insulating film and said plurality of third-layer metal dummy patterns; and
    a plurality of fourth-layer metal dummy patterns formed on portions of an upper surface of said fourth interlayer insulating film other than portions above said plurality of third-layer metal dummy patterns and arranged in stripes at said first intervals in said first direction,
    wherein each of said plurality of fourth-layer metal dummy patterns extends in said second direction,
    each of said plurality of fourth-layer metal dummy patterns is positioned above a corresponding one out of said plurality of second-layer metal dummy patterns,
    a width of each of said plurality of fourth-layer metal dummy patterns in said first direction is equal to that of said first-layer metal dummy pattern in said first direction, and
    an interval between said plurality of third-layer metal dummy patterns and said plurality of fourth-layer metal dummy patterns in said third direction is equal to said second interval.

* * * * *

UNITED STATES PATENT AND TRADEMARK OFFICE
CERTIFICATE OF CORRECTION

PATENT NO. : 6,784,548 B2
DATED : August 31, 2004
INVENTOR(S) : Kouno et al.

It is certified that error appears in the above-identified patent and that said Letters Patent is hereby corrected as shown below:

Title page,
Insert Item -- [30]     Foreign Application Priority Data
            Jun. 15, 2001 (JP)................................2001-181428 --

Signed and Sealed this

Fourteenth Day of December, 2004

JON W. DUDAS
*Director of the United States Patent and Trademark Office*